United States Patent
Schanzenbach et al.

(10) Patent No.: US 12,241,559 B2
(45) Date of Patent: Mar. 4, 2025

(54) PRESSURE COMPENSATION ELEMENT

(71) Applicant: STEGO HOLDING GMBH, Schwäbisch Hall (DE)

(72) Inventors: Bernd Armin Schanzenbach, Mainhardt Geisselhardt (DE); Susanne Luz, Waiblingen (DE)

(73) Assignee: STEGO HOLDING GMBH, Schwäbisch Hall (DE)

( * ) Notice: Subject to any disclaimer, the term of this patent is extended or adjusted under 35 U.S.C. 154(b) by 0 days.

(21) Appl. No.: 18/037,382

(22) PCT Filed: Nov. 12, 2021

(86) PCT No.: PCT/EP2021/081511
§ 371 (c)(1),
(2) Date: May 17, 2023

(87) PCT Pub. No.: WO2022/106310
PCT Pub. Date: May 27, 2022

(65) Prior Publication Data
US 2023/0407983 A1 Dec. 21, 2023

(30) Foreign Application Priority Data

Nov. 17, 2020 (DE) .................. 10 2020 130 303.3
Dec. 2, 2020 (DE) .................. 10 2020 131 994.0

(51) Int. Cl.
*F16K 24/04* (2006.01)
*F16K 17/18* (2006.01)

(52) U.S. Cl.
CPC .............. *F16K 17/18* (2013.01); *F16K 24/04* (2013.01)

(58) Field of Classification Search
CPC .......... F16K 24/00; F16K 24/04; F16K 24/06; B65D 90/34
See application file for complete search history.

(56) References Cited

U.S. PATENT DOCUMENTS 8,292,109 B2 * 10/2012 Lauk ................ F16H 57/027
220/203.11
8,881,931 B2 * 11/2014 Chiu ................ H05K 5/0216
220/372

(Continued)

FOREIGN PATENT DOCUMENTS

DE 202004001139 U1 4/2004
DE 102007050921 5/2009

(Continued)

OTHER PUBLICATIONS

Search Report issued in Appl. No. PCT/EP2021/081511 (Feb. 18, 2022).

*Primary Examiner* — Hailey K. Do
(74) *Attorney, Agent, or Firm* — Barnes & Thornburg LLP

(57) ABSTRACT

A pressure compensation element for installation in a housing wall, comprising a base part and a cover part arranged on the base part, wherein at least one gas exchange channel, in which a gas-permeable membrane is arranged, is provided in the pressure compensation element centrally in the middle with respect to the axis of the gas flow direction, wherein the base part has, on its side facing the cover part, in the gas exchange channel or at its end, a retaining grid on which the membrane is arranged, and wherein the base part has on the outside a circumferential annular collar through which gas exchange openings lead. The base part has on its nozzle at least two groups of radially outwardly facing locking elements, wherein the locking elements of the respective groups have a uniform height in themselves but a height which is different from the respective locking elements of the other groups.

6 Claims, 2 Drawing Sheets

(56) References Cited

U.S. PATENT DOCUMENTS

| | | | |
|---|---|---|---|
| 11,047,508 B2 * | 6/2021 | Sanders | ............... F16K 15/148 |
| 2011/0275305 A1 | 11/2011 | Egersdoerfer et al. | |
| 2015/0239660 A1 | 8/2015 | Egersdoerfer et al. | |
| 2019/0331312 A1 | 10/2019 | Wei | |

FOREIGN PATENT DOCUMENTS

| | | | | |
|---|---|---|---|---|
| GB | 2217767 A | * | 11/1989 | ........... B65D 90/023 |
| WO | WO 2008/077667 | | 7/2008 | |
| WO | WO 2010/076326 | | 7/2010 | |

* cited by examiner

PRESSURE COMPENSATION ELEMENT

CROSS REFERENCE TO RELATED APPLICATIONS

This application is a U.S. nationalization under 35 U.S.C. § 371 of International Application No. PCT/EP2021/081511, filed Nov. 12, 2021, which claims priority to German Patent Application No. 102020130303.3, filed Nov. 17, 2020, and German Patent Application No. 102020131994.0, filed Dec. 2, 2020. The disclosures set forth in the referenced applications are incorporated herein by reference in their entireties.

FIELD OF THE DISCLOSURE

The invention relates to pressure compensation elements for installation in housing walls. These comprise a base part and a cover part arranged on the base part. At least one gas exchange channel is provided in the pressure compensation elements, in which a gas-permeable membrane is arranged.

BACKGROUND

In cabinets and enclosures with a high degree of protection, different pressure conditions occur due to internal and external temperature changes. The pressure changes can cause damage to the seals of the cabinet. These often lose their IP class (dust and water tightness). Furthermore, the pressure compensation element enables humid air to escape but not to penetrate into the cabinet="moisture valve". Pressure compensation elements are known, for example, from DE 20 2004 001 139 or DE 10 2007 050 921. The filter element in the gas exchange channel is usually designed as a microporous membrane that is permeable to air and moisture vapor but impermeable to water, dust and dirt. The membrane can be of hydrophobic and oleophobic design. The membrane prevents liquid, for example water, from entering the interior of the housing, but at the same time allows gas exchange from the interior of the housing with the environment. The pressure compensation elements can be assigned to different protection classes such as IP66, IP67 or IP68. These pressure compensation elements are usually fixed to/in the enclosure walls by means of a screw connection.

SUMMARY

The present invention is based on the object of designing and further developing such elements in such a way that they can be fixed more easily to/in the housing walls.

According to the invention, the object is solved by the subject matter of the present disclosure.

Preferred embodiments of the invention are also given in the present disclosure.

In principle, the cover part can be fastened to the base part by any means, e.g. by welding, in particular ultrasonic welding or laser welding, by bonding or by friction locking, while maintaining a positive connection. In a preferred embodiment of the present invention, the cover part is fastened to the base part by means of a snap-in or clip connection. For this purpose, the edge of the cover part is slipped externally over a circumferential annular flange of the base part, so that latching elements, for example latching hooks, of the cover part with radially inwardly directed latching elements can latch into corresponding recesses or preferably around the circumferential annular flange of the base part. Preferably, the cover part is fastened to the base part by means of a clamping or latching connection, wherein in particular knobs or a continuous bead are arranged on the inner sides of the cover edge, which enable locking similar to latching hooks. This type of locking enables a detachable connection to be made between the cover part and the base part, while at the same time ensuring that the cover part and the base part are sealingly connected to one another in the area of the locking, i.e. around the outside of the annular flange. These fastenings of the cover part to the base part allow relatively short process times in the manufacture of the pressure compensation element.

Gas exchange openings are arranged in the circumferential annular flange of the base part. These openings are preferably round and in particular evenly distributed over the circumference of the annular flange. The gas exchange openings preferably have small diameters, in particular about 1.5 mm to 4 mm. It is preferred if, for an outermost diameter of the base part of 35 to 70 mm, there are 10 to 20, in particular 13 to 17, gas exchange openings.

The base part and the cover part can be designed to be essentially rotationally symmetrical, in particular they have a circular outer shape. This facilitates the insertion of the pressure compensation element into a bore of a housing. However, it is also conceivable to implement other geometries. The gas exchange channel and the sealing element (the membrane) thus preferably also have a circular cross-section.

The base part and the cover part can be made of plastic, which makes it possible to manufacture the pressure compensation element in large quantities at particularly low cost. However, the base part and the cover part can also be made of metal, in particular stainless steel, in order to exhibit particularly high media and temperature resistance.

The base part represents a tube-like structure which essentially has two directly adjacent intimately joined or integral sections: a nozzle, on which radially outwardly directed locking elements are arranged, and a collar, which represents a widening of the diameter and which has a further circumferential annular flange on the outside. The nozzle is the part of the base part that is guided through an opening in a housing wall, and the collar is the wider part that prevents it from slipping through. The annular flange represents a further extension of the diameter. In this case, the annular flange is arranged approximately centrally with respect to the collar, i.e., it represents a protrusion of the collar and protrudes beyond the other diameter of the collar. The base part and the cover part are matched in this case to each other so that the annular wall of the cover part, when assembled, projects beyond the circumferential annular flange, but not so far that the edge of the annular wall ends at the same height, or even further, as the collar begins, as seen from the nozzle. In other words, with the pressure compensation element inserted into a housing, a gap remains between the lower edge of the annular wall of the cover and the housing wall. Gas or water vapor flowing through the pressure compensation element can escape through this gap.

Pressure compensation elements in the sense of the present invention can vary greatly in their dimensions and are in principle not limited in size, wherein the exact size also depends on the specific application or housing in which they are to be installed. Just for example, they can have an outermost diameter of 40 to 75 mm and a height of 10 to 50 mm. In the case of a welded or bonded membrane, it is not necessary to secure it by means of a securing element, so that the pressure compensation element can have a lower height in its entirety; for these embodiments, heights of 15 mm to 20 mm are preferred. This lower height also has the advantage that the installed pressure compensation elements are less susceptible to damage from accidental impact (less "impact area").

The pressure compensation elements of the present invention may have a seal on the side of the collar facing the nozzle. In particular, this may be a seal extending around the nozzle, for example in the form of an O-ring. The seal is preferably made of an elastic material.

An important aspect of the present invention is that the pressure compensation element according to the invention is not fixed via a screw connection to/in a housing wall, but via locking elements. These locking elements are arranged on the lower part of the base part, the nozzle, directed radially outwards and are in particular designed in the form of latching hooks. Furthermore, within the scope of the present invention, in particular a plurality of groups of locking elements, preferably latching hooks, are formed on the nozzle of the base part. In the context of the present invention, at least two groups of locking elements are present on the pressure compensation elements according to the invention, but three groups or four groups or more groups may also be present. Per group, at least three locking elements are provided, evenly distributed over the circumference of the nozzle. The exact number is variable and is selected depending on the size of the pressure compensation element, the materials used and the number of groups. By using several groups of locking elements, preferably latching hooks, it is possible to use the same pressure compensation element for housings with different wall thicknesses. When the pressure compensation element is inserted into the housing, the locking elements are pressed inward against the nozzle of the base part while being pushed through the housing wall. After the respective locking elements have passed the housing wall, they spring outward, thus locking the pressure compensation element in the housing wall. If the housing wall is so thick that not all groups of locking elements, preferably latching hooks, emerge on the inside of the housing, the latching hooks that are not needed simply remain pressed against the nozzle of the base part by the housing wall. The individual groups of locking elements differ in the height of the respective locking hooks and, as a result, the distance between their upper edge and the collar of the base part. Within a group, the locking hooks are uniform in height/length. Furthermore, the latching hooks are those which are sufficiently known from the prior art for many different applications. The exact number of groups can be specified here based on the desired flexibility; for example, if only two housing wall thicknesses are common, it may be useful to manufacture pressure compensation elements with only two groups of latching hooks, if, for example, four housing wall thicknesses are common, it may be useful to manufacture four groups of latching hooks.

In the context of the present invention, the locking of the pressure compensation element in the housing wall is preferably a combination of a locking element, preferably a latching hook, and a seal. The seal seals the edge (water forming on the housing wall would otherwise flow into the interior) and has elasticity for over-pressing during assembly; i.e., when the pressure compensation element is pressed by the housing wall, the seal is strongly compressed and relaxes upon termination of the mounting pressure, so that the sealing element is "pulled" out of the housing up to the correspondingly exposed locking elements, preferably latching hooks. This ensures "clamping" and sealing. This preferred embodiment thus combines the locking elements with the sealing ring, whereby sealing and spring-elastic locking are combined.

Common wall thicknesses of housings are, for example, 3 mm or 4 mm. For these cases, pressure compensation elements according to the invention with two groups of locking elements, preferably latching hooks, could be used, for example, in which the distance of the latching hooks from the collar of the base part is 3 mm in the case of a first group and 4 mm in the case of a second group, although further groups with further distances may be present. In the event that it is not known what the wall thickness is, for example, a pressure compensation element according to the invention can be used in which a plurality of groups are present, each with a different spacing of latching hooks from the collar of the base part, for example with 3 mm, 4 mm, 5 mm and 6 mm. The pressure compensation elements of the invention are preferably configured to be used in housings having housing wall thicknesses of 0.5 mm to 8 mm, preferably 1 mm to 4 mm. However, the present invention is by no means limited to such wall thicknesses/spacings.

The present invention considerably simplifies the manufacturing process of pressure compensation elements and makes it more cost-effective. It is also advantageous from a logistical point of view, since fewer different products need to be kept in stock. Furthermore, it is no longer necessary to keep screw sleeves or nuts on hand for fastening; creeping loosening of the screw connection and an associated reduction in the sealing effect are also avoided. A further advantage of the present invention is that the rotary fastener is no longer required; it is thus possible to rotate the pressure compensation element to a specific position without this being limited by a screw thread, which is advantageous, for example, in the case of inscriptions. In addition, the installation of the pressure compensation elements according to the invention is significantly easier and faster compared to conventional ones with screw locking. Consequently, these and other advantageous effects result from the present invention.

In preferred embodiments, the gas-permeable membrane is fixed in the gas exchange channel on a retaining grid. In principle, fixing can be carried out in any way, with adhesive bonding and welding, in particular ultrasonic welding, being preferred methods. The advantage of this fixation on the retaining grid is that no additional securing element is required. It is preferable to fix the membrane on the retaining grid by means of ultrasonic welding. Thus, no further fixation by means of a securing element is necessary, so that the overall height of the pressure compensation element is reduced. Further, it is an advantage of the present invention that the components could be reduced by two parts (spacer and screw nut) and the low discharge.

In preferred embodiments of the present invention, there are a number of spacer elements spaced apart from one another in the interior of the cover part, preferably in the form of individual lamellae arranged upright, which ensure that, in the assembled state, a gap remains between the inner cover surface of the cover part and the upper edge of the collar from the base part. The individual spacer elements are preferably also designed to direct the gas flow coming from the gas exchange channel outward toward the cover ring wall. The spacer elements are preferably arranged in the form of a circle on the inner surface of the cover and, when assembled, press against the surface of the collar or against the retaining grid or the membrane arranged on the retaining grid. At the annular wall, the gas flow is then diverted and directed towards the gas exchange openings located in the circumferential annular flange, through which the gas then exits the pressure compensation element.

In preferred embodiments of the present invention, the latching hooks arranged on the nozzle wall are additionally configured to form slit-like openings (slot openings) in the nozzle wall. Through these slot openings, gas can flow from the interior of the housing, in addition to the normal flow of glass through the gas exchange channel.

The spacer elements in conjunction with the gap, the gas exchange openings, the annular wall form a labyrinth-like structure, in particular one in which the cover part is turned over its annular wall over an annular flange running around the outside of the collar of the base part and forms a circumferential gap with the outside of the collar of the base part between the inner surface of the cover and the circumferential annular flange, in which circular spacer elements are arranged in the cover part, which spacer elements are configured together with the upper edge of the base part to form a gap between the inner surface of the cover and the upper edge of the base part, and in which gas exchange openings are arranged in the circumferential annular flange. This additionally impedes the unwanted penetration of water or foreign bodies from outside into the pressure compensation element and achieves an even higher tightness of the pressure compensation element against external impurities.

If, in preferred embodiments, the slot openings are present in the nozzle or nozzle wall of the base part, it can be achieved that the flow capacity into the pressure compensation element is increased compared to those without slot openings, which is a considerable advantage since the additional slot openings result in a significantly improved gas flow functionality.

In this respect, it is also a subject matter of the present invention to provide a ventilation system for pressure compensation elements, in particular pressure compensation elements according to the present invention, comprising the following elements:

i) a base part having a gas exchange channel in its center and slot openings in the outer wall of its nozzle,
ii) a gas-permeable membrane arranged in the gas exchange channel, or at the end thereof,
iii) a cover part whose annular wall is turned over an annular flange extending around the outside of the collar of the base part and forms a circumferential gap with the outside of the collar of the base part between the inner surface of the cover and the circumferential annular flange,
iv) circular spacer elements in the cover part configured together with the upper edge of the base part to form a gap between the inner surface of the cover and the upper edge of the base part,
v) gas exchange openings in the circumferential annular flange,
wherein the pressure compensation elements can have a seal on the side of the collar facing the nozzle, which seal is preferably a seal, for example in the form of an O-ring, extending around the nozzle and is in particular made of an elastic material,
wherein elements iii), iv) and v) together form a labyrinthine structure.

BRIEF DESCRIPTION OF THE DRAWINGS

Further advantageous embodiments and details of the invention can be found in the following description, in which the invention is described and explained in more detail on the basis of the exemplary embodiments shown in the drawing, wherein the description is not to be interpreted as being limited to the drawings.

DETAILED DESCRIPTION

Figure 1:
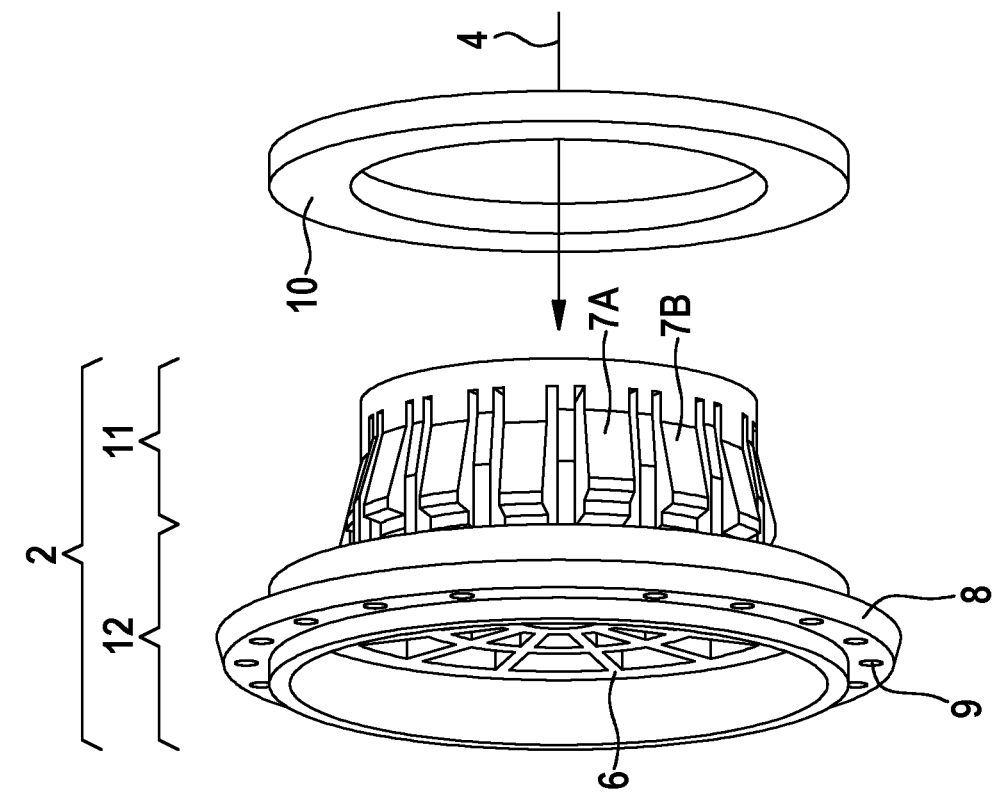
FIG. 1 shows an exploded view of a pressure compensation element according to the invention.

FIG. 1 shows the individual parts of a pressure compensation element according to the invention, which is designated in its entirety by the reference sign 1, in the form of an exploded view. The pressure compensation element 1 essentially has a base part 2 on which a cover part 3 is arranged. A central gas exchange channel 4 is provided in the pressure compensation element 1, in which a filter element in the form of a microporous membrane 5 is arranged. The membrane 5 is permeable to air and gas, but impermeable to water, dirt and dust; it can be referred to as a breathable membrane 5. For fixing the membrane 5 in the gas exchange channel 4 of the base part 2, a retaining grid 6 is provided, on which the membrane is arranged in a sealing manner, preferably by means of ultrasonic welding.

The base part 2 has a substantially cylindrical nozzle 11 which is provided on its outer side with locking elements, preferably latching hooks, 7A, 7B. At its end facing the cover part 3, the nozzle 11 opens into a collar 12, which has a circumferential annular flange 8.

The latching hooks 7A, 7B secure the pressure compensation element 1 to the wall of the housing in which it is inserted. In connection with the present invention, it should be noted that only 2 groups of latching hooks are shown in the drawings for clarity. However, it is equally well possible to realize three groups, four groups or even more groups of latching hooks.

The cover part 3 preferably has knobs or a bead 15 on the inside of its ring wall 13 for locking. These can be used to press the cover part over the circumferential annular flange 8 of the base part 2 and lock it in place. The ring wall 13 is designed in such a way that its lower edge does not reach the lower end of the collar 12 after assembly. Inside the cover part 3 there are a number of spacer elements 14 spaced apart from one another, preferably in the form of upright individual lamellae, which ensure that in the assembled state a gap 16 remains between the base surface of the cover part 3 and the upper edge of the collar 12 of the base part 2. The individual spacer elements 14 are preferably arranged in the form of a circle and are designed in such a way that they guide the gas flow coming from the gas exchange channel 4 outward toward the annular wall 13. There, the gas flow is then diverted and directed towards the gas exchange openings 9 located in the circumferential annular flange 8, through which the gas then exits the pressure compensation element 1.

The spacer elements 14 in conjunction with the gap 16, the gas exchange openings 9 and the annular wall 13 form a labyrinth-like structure, making it more difficult for water or foreign bodies to penetrate the pressure compensation element 1 unintentionally from the outside, and consequently achieving increased tightness against external contamination.

Thus, gas (e.g., air and moisture vapor) can be exchanged along a first channel section formed within the nozzle 11 of the base part 2 and extending to the membrane 5 and further along a second channel section extending from the membrane 5 through the attached cover part 3 to the gas exchange openings 9.

The pressure compensation element 1 can be installed in a housing wall. For this purpose, the housing wall has an installation opening adapted to the outer shape of the pressure compensation element, preferably a circular installation opening, into which the base part 2 of the pressure compensation element 1 is inserted up to the collar 12. The pressure compensation element 2 is then secured to the housing wall by means of the latching hooks 7A, 7B, which are arranged on the nozzle 11. In order to prevent even more reliably that gas or liquid can be exchanged through the installation opening in the housing wall, a sealing element, preferably in the form of an O-ring 10, can be arranged between the collar 12 of the base part 2 and the housing wall.

Figure 2:
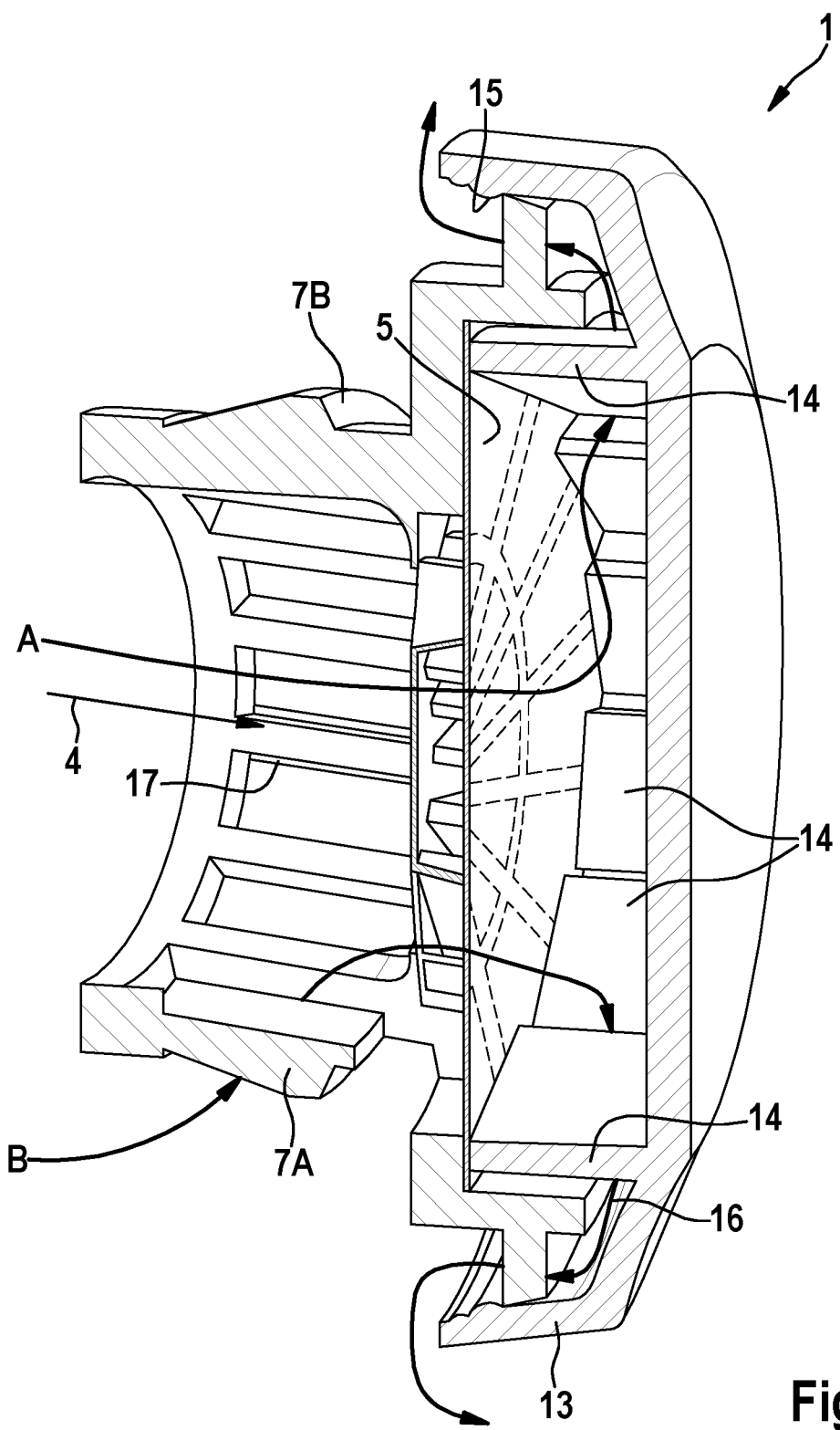
FIG. 2 shows a sectional view of an assembled pressure compensation element according to the invention.

In FIG. 2, a preferred embodiment of the pressure compensation element 1 of the present invention is shown in assembled form. Also shown in this figure is the flow of gas from the interior of the housing through the pressure compensation element 1 of the present invention to the housing environment in a preferred embodiment.

The gas from the interior of the housing flows along A into the gas exchange channel 4 arranged centrally in the middle, then into the cover part 3, where it is diverted by the, preferably lamellar, spacer elements 14 outwardly to the annular wall 13 of the cover part 13 and from there through the gap 16 and outwardly through the gas exchange openings 9.

In the embodiment according to the invention, which is illustrated in FIG. 2, the nozzle 11 and the latching hooks 7A, 7B arranged thereon are designed in such a way that they form slit-like openings (slot openings) 17 in the wall of the nozzle. Through these slot openings 17, gas can flow from inside the housing along B in addition to the normal flow of glass along A. This means a considerable increase in the gas inflow capacity of this pressure compensation element compared to pressure compensation elements without this design and in particular compared to conventional pressure compensation elements with screw fastenings.

The invention claimed is:

1. A pressure compensation element for installation in a housing wall, comprising:
    a base part, the base part formed to define a nozzle extending along an axis of a gas flow direction; and
    a cover part arranged on the base part,
    wherein at least one gas exchange channel, in which a gas-permeable membrane is arranged, is provided in the pressure compensation element centrally with respect to the axis of the gas flow direction,
    wherein the base part has, in the gas exchange channel or at an end of the gas exchange channel, a retaining grid facing the cover part and on which the gas-permeable membrane is arranged, and wherein the base part has on an outside thereof a circumferential annular flange through which gas exchange openings lead,
    wherein the base part has on its nozzle at least two groups of radially outwardly facing locking elements, wherein the locking elements of a respective group have a uniform height along the nozzle that is different from a height along the nozzle of the locking elements of other respective groups of the at least two groups,
    wherein
    i) the base part is further formed to define a collar, the nozzle opens into the collar, the cover part defines an annular wall that is turned over the circumferential annular flange extending around an outside of the collar of the base part and forms a circumferential gap with the outside of the collar of the base part between an inner surface of the cover part and the circumferential annular flange;
    ii) the cover part is formed to define spacer elements in an interior of the cover part, the spacer elements are configured, together with an upper edge of the base part, to form a gap between the inner surface of the cover part and the upper edge of the base part, the spacer elements are arranged in a circle; and
    iii) the gas exchange openings are arranged in the circumferential annular flange, wherein elements i), ii), and iii) together form a labyrinthine structure.

2. The pressure compensation element according to claim 1, further comprising a seal on a side of the collar facing the nozzle.

3. The pressure compensation element according to claim 1, wherein each locking element of the at least two groups of locking elements is a latching hook.

4. The pressure compensation element according to claim 3, wherein each latching hook is arranged on the nozzle of the base part to define slot openings in the nozzle.

5. The pressure compensation element according to claim 1, wherein the gas-permeable membrane on the retaining grid is either
    bonded or welded.

6. The pressure compensation element according to claim 5, wherein the gas-permeable membrane on the retaining grid is ultrasonically welded.

* * * * *